(12) United States Patent
Hozono et al.

(10) Patent No.: US 10,398,068 B2
(45) Date of Patent: Aug. 27, 2019

(54) ELECTROMAGNETIC SHIELDING SHEET AND MANUFACTURING METHOD FOR SAME

(71) Applicant: Molex, LLC, Lisle, IL (US)

(72) Inventors: Hideki Hozono, Yamato (JP); Mikiji Tanaka, Yamato (JP); Daisuke Yoshikawa, Yamato (JP); Kazumi Yamamoto, Hiroshima (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/715,331

(22) Filed: Sep. 26, 2017

(65) Prior Publication Data

US 2018/0092260 A1    Mar. 29, 2018

Related U.S. Application Data

(60) Provisional application No. 62/400,975, filed on Sep. 28, 2016.

(30) Foreign Application Priority Data

Sep. 8, 2017 (JP) .................. 2017-173210

(51) Int. Cl.
*H05K 9/00* (2006.01)
*H05K 1/02* (2006.01)

(52) U.S. Cl.
CPC ......... *H05K 9/0088* (2013.01); *H05K 1/0218* (2013.01); *H05K 9/0083* (2013.01)

(58) Field of Classification Search
CPC ............ H01F 41/16; H01F 1/344; H01F 1/37; H01Q 17/004; H05K 9/0083; H05K 9/0088; H05K 9/0075; H05K 9/00; H01B 1/24; H01B 1/18; H01L 23/552; H01L 23/522; C04B 35/2658; C08K 3/04; C08K 3/042; C08K 7/24; C08K 2201/011; C08K 2201/014; Y10T 428/31663
USPC .................. 264/105; 523/137; 524/435, 495; 252/511, 62.56, 506; 257/E23.114, 257/E23.11; 174/350, 391; 361/818; 427/58; 428/411.11, 447
See application file for complete search history.

(56) References Cited

U.S. PATENT DOCUMENTS

| | | | | |
|---|---|---|---|---|
| 4,690,778 | A | * | 9/1987 | Narumiya ........... C04B 35/2658 174/388 |
| 9,380,736 | B2 | | 6/2016 | Yamamoto |
| 2010/0181107 | A1 | * | 7/2010 | Yamamoto .............. H01F 1/344 174/378 |

FOREIGN PATENT DOCUMENTS

| | | | |
|---|---|---|---|
| JP | H54-061239 | * | 5/1979 |
| JP | 06-204682 A | | 7/1994 |
| JP | 2002-050506 A | | 2/2002 |
| JP | 2002-060554 A | | 2/2002 |
| JP | 2007-129179 | * | 5/2007 |
| JP | 4849220 A2 | | 1/2012 |
| JP | 5103780 B2 | | 12/2012 |
| JP | 2013-229541 A | | 11/2013 |
| JP | 5876818 B2 | | 3/2016 |
| JP | 5938342 B2 | | 6/2016 |

* cited by examiner

*Primary Examiner* — Camie S Thompson
(74) *Attorney, Agent, or Firm* — Molex, LLC

(57) ABSTRACT

The present disclosure provides an electromagnetic shielding sheet characterized in that the sheet includes, electrically conductive carbon, a soft magnetic powder, and a base material made from a resin in which a filler including the conductive carbon and the soft magnetic powder has been mixed.

17 Claims, 2 Drawing Sheets

| | Sheet thickness | Unit: vol% | | | | O:good △: poor ×:bad | | | |
|---|---|---|---|---|---|---|---|---|---|
| | | Resin | Magnetic filler | Conductive filler | Total | Shielding property (≧5dB) | | | |
| | Unit:μm | Silicone | Carbonyl Iron Powder | ELECTRICALLY CONDUCTIVE CARBON | | at:10GHz | at:20GHz | at:30GHz | at:40GHz |
| Case1 | 250 | 71.5 | 23.0 | 5.5 | 100.0 | O | O | O | O |
| Case2 | 250 | 72.0 | 23.0 | 5.0 | 100.0 | O | O | O | O |
| Case3 | 250 | 73.0 | 23.0 | 4.0 | 100.0 | O | O | O | O |
| Case4 | 250 | 77.0 | 23.0 | 0.0 | 100.0 | × | × | × | × |
| Case5 | 250 | 66.0 | 23.0 | 11.0 | 100.0 | -- | -- | -- | -- |
| Ref.1 | 250 | 45.0 | 55.0 | 0.0 | 100.0 | × | △ | O | O |
| Ref.2 | 250 | -- | -- | -- | -- | O | O | O | O |

| | Sheet thickness | Resin | Magnetic filler | Conductive filler | | Shielding property (≧5dB) ○:good, △:poor, ×:bad | | | |
|---|---|---|---|---|---|---|---|---|---|
| | Unit: μm | Silicone | Carbonyl Iron Powder | ELECTRICALLY CONDUCTIVE CARBON | Total | 10GHz | 20GHz | 30GHz | 40GHz |
| | | Unit:vol% | | | | | | | |
| Case 6 | 250 | 67 | 23 | 10 | 100 | ○ | ○ | ○ | ○ |
| Case 7 | 250 | 71 | 23 | 6 | 100 | ○ | ○ | ○ | ○ |
| Case 8 | 250 | 74 | 23 | 3 | 100 | ○ | ○ | ○ | ○ |
| Case 9 | 250 | 75 | 23 | 2 | 100 | ○ | ○ | ○ | ○ |
| Case 10 | 250 | 55 | 35 | 10 | 100 | ○ | ○ | ○ | ○ |
| Case 11 | 250 | 59 | 35 | 6 | 100 | ○ | ○ | ○ | ○ |
| Case 12 | 250 | 62 | 35 | 3 | 100 | ○ | ○ | ○ | ○ |
| Case 13 | 250 | 75 | 15 | 10 | 100 | ○ | ○ | ○ | ○ |
| Case 14 | 250 | 79 | 15 | 6 | 100 | ○ | ○ | ○ | ○ |
| Case 15 | 250 | 82 | 15 | 3 | 100 | △ | △ | ○ | ○ |
| Ref. 3 | 250 | 87 | 10 | 3 | 100 | × | ○ | ○ | ○ |
| Ref. 4 | 250 | 57 | 40 | 3 | 100 | ○ | ○ | ○ | ○ |

ELECTROMAGNETIC SHIELDING SHEET AND MANUFACTURING METHOD FOR SAME

RELATED APPLICATIONS

This application claims priority to U.S. Provisional Patent Application No. 62/400,975, filed Sep. 28, 2016 and Japanese Application No. 2017-173210, filed Sep. 8, 2017, both of which are incorporated herein by reference in their entireties.

TECHNICAL FIELD

The present disclosure relates to an electromagnetic shielding sheet. In greater detail, the present disclosure relates to an electromagnetic shielding sheet for shielding electromagnetic waves generated from an electronic component mounted on a circuit board while maintaining flexibility.

BACKGROUND ART

Examples of the electromagnetic shielding sheet belonging to the technical field of the present disclosure are known to include sheets having laminated structures like those disclosed in Patent Document 1 through Patent Document 7. Such an electromagnetic shielding sheet is, for example, arranged and used by sandwiching said sheet in a gap occurring between a circuit board and a connector mounted on said circuit board. It is preferable at that time that appropriate thickness and elasticity are provided for increasing adhesion and contour following so that an empty space does not occur in a gap between the circuit board and the electromagnetic shielding sheet or a gap between the electromagnetic shielding sheet and the connector. Furthermore, in general, it is preferable that the shielding properties of the electromagnetic shielding sheet be such that a shielding amount is large in a band where the frequency is 10 through 40 GHz.

Patent Document 1: Japanese Patent No. 5876818
Patent Document 2: Japanese Unexamined Patent Application No. 2013-229541
Patent Document 3: Japanese Unexamined Patent Application Publication No. No. 2002-060554
Patent Document 4: Japanese Unexamined Patent Application Publication No. No. 2002-050506
Patent Document 5: Japanese Unexamined Patent Application No. H06-204682
Patent Document 6: Japanese Patent No. 5938342
Patent Document 7: U.S. Pat. No. 4849220

SUMMARY

An object of the present disclosure is to provide an electromagnetic shielding sheet having a large shielding amount in a desired frequency band while providing appropriate thickness and elasticity.

The electromagnetic shielding sheet according to the present disclosure is characterized in that the sheet includes electrically conductive carbon, a soft magnetic powder, and a base material made from a resin in which a filler including the conductive carbon and the soft magnetic powder has been mixed.

The method for manufacturing an electromagnetic shielding sheet according to the present invention is characterized in that the method includes a step for generating a filler formed by mixing electrically conductive carbon with a soft magnetic powder, and a step for mixing said filler into a base material made from a resin.

BRIEF DESCRIPTION OF THE DRAWINGS

FIG. 2 is a table showing the formulation and shielding characteristics of an electromagnetic shielding sheet according to the present disclosure.

DETAILED DESCRIPTION OF THE PREFERRED EMBODIMENTS

Figures 1, 3:
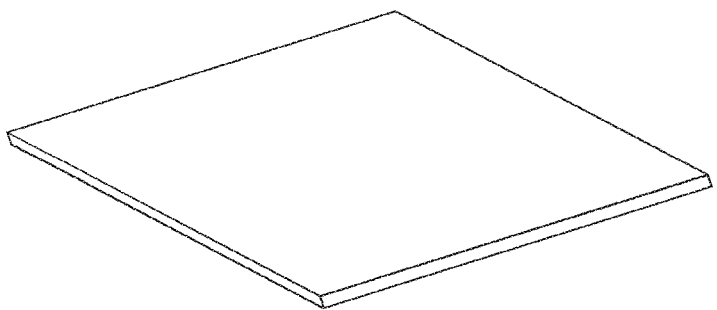
FIG. 1 is a table showing the formulation and shielding characteristics of an electromagnetic shielding sheet according to the present disclosure.
FIG. 3 is a substantially perspective view of an electromagnetic shielding sheet according to the present disclosure.

The inventors realized an electromagnetic shielding sheet provided with appropriate electromagnetic shielding sheet thickness and elasticity, and that is an electromagnetic shielding sheet where a shielding amount is at least 5 dB in the frequency band listed to the left (10 through 40 GHz).

The electromagnetic shielding sheet according to the present disclosure is formed by taking a conductive and magnetic filler formed by mixing electrically conductive carbon and a soft magnetic powder, and then mixing said conductive and magnetic filler in a base material (matrix) made from a resin.

The electrically conductive carbon may include conductive carbon black, fibrous carbon, graphite, graphite fibers, and the like. Furthermore, for example, the electrically conductive carbon black may be in a granular or powder form, and may be granular with a hollow shell structure. Moreover, the electrically conductive carbon black is provided with a particle structure where the particle diameter is 20 to 60 nm, and the BET specific surface area is 30 to 1300 $m^2/g$. In the present disclosure, a highly-conductive granular carbon (for example, Ketjenblack (Registered Trademark)) provided with the aforementioned hollow shell structure is used to describe the aforementioned electrically conductive carbon black. Note that the aforementioned highly electrically conductive carbon black may be provided with a hollow shell structure where the particle diameter is 30 to 40 nm, and the BET specific surface area is 700 to 1300 $m^2/g$.

The soft magnetic powder may include ferrites, such as magnetite (magnetic iron steel), Ni—Zn ferrites, Mn—Zn ferrites, spinel ferrites, and the like or, sendust, silicon steel, iron, carbonyl iron, or the like. Furthermore, the powder form of these may be any form, such as spherical, granular, flat, and the like, and a granular carbonyl iron powder is used in the present disclosure to describe the soft magnetic powder. Note that when a metal-based soft magnetic powder is used, a phosphoric acid type surface treatment may be carried out or a surface treatment may be applied using a silane coupling material in order to prevent corrosion of the powder.

The base material may include styrene type thermoplastic elastomers, olefinic thermoplastic elastomers, polyester type thermoplastic elastomers, polyamide type thermoplastic elastomers, urethane type thermoplastic elastomers, silicone type elastomers, and the like. In the present disclosure, a silicone type elastomer is used to describe the base material. Note that, in consideration of the aforementioned applications, the optimal sheet thickness is preferably 200 to 1,000 µm (micrometers), however, when a silicone type elastomer is used, approximately 250 µm is best for adhesion, contour following, and workability. Therefore, the thickness of the electromagnetic shielding sheet described in the present disclosure is 250 μm. Note that the thickness of the sheet may be changed appropriately to fit a given application.

FIG. 1 illustrates volume ratios (vol %) and shielding properties expressing material formulations for Embodiments 1 through 5 and Comparative Examples 1 and 2. The shielding properties illustrated in FIG. 1 are shielding amounts measured using a coaxial waveguide method (in the case of frequency 10 GHz) or a free space measurement method (in the case of frequencies of 20 to 40 GHz). In the figure, a circle is used to indicate that the shielding properties are good when the shielding amount is at least 5 dB, a triangle is used to indicate that the shielding properties are moderate when the shielding amount is close to 5 dB, and an X is used to indicate that the shielding properties are not desirable when the shielding amount is less than 5 dB.

The electromagnetic shielding sheet was manufactured by producing a magnetic and conductive filler formed by mixing a volume ratio of 0 to 11.0 vol % of a highly electrically conductive carbon, as an electrically conductive carbon, with a volume ratio of 23 vol % of a carbonyl iron powder, as a soft magnetic powder, and then applying a mixture of the magnetic and conductive filler and approximately 65 to 80 vol % of a silicone type elastomer, as a base material, on a carrier film. Note that, additives, such as a flame retardant, an oxidation preventative, and the like, may be added to the electromagnetic shielding sheet, as necessary. Furthermore, as illustrated in FIG. 2, the structure of the electromagnetic shielding sheet according to the present invention may be, for example, that of a flat sheet.

Next, in Embodiments 1 through 4 according to the present disclosure, electromagnetic shielding sheets were manufactured by fixing the volume ratio of the carbonyl iron powder at 23 vol %, and then varying the volume ratios of the highly electrically conductive carbon and the silicone type elastomer. Judgment results for shielding properties obtained by measuring electromagnetic shielding sheet shielding amounts will be described next.

An electromagnetic shielding sheet—formed by mixing a magnetic and conductive filler, into which 5.5 vol % of a highly electrically conductive carbon was mixed, with a 71.5 vol % silicone type elastomer—exhibited good properties at 10 to 40 GHz.

An electromagnetic shielding sheet—formed by mixing a magnetic and conductive filler, into which 5.0 vol % of a highly electrically conductive carbon was mixed, with a 72.0 vol % silicone type elastomer—exhibited good properties at 10 to 40 GHz.

An electromagnetic shielding sheet—formed by mixing a magnetic and conductive filler, into which 4.0 vol % of a highly electrically conductive carbon was mixed, with a 73.0 vol % silicone type elastomer—exhibited good properties at 10 to 40 GHz.

An electromagnetic shielding sheet—formed by mixing a magnetic filler of just carbonyl iron powder, into which a highly electrically conductive carbon had not been mixed, with a 77.0 vol % silicone type elastomer—did not satisfy desired shielding properties at 10 to 40 Ghz. That is, the shielding amount of the electromagnetic shielding sheet according to the present embodiment was less than 5 dB at 10 to 40 Ghz.

In an electromagnetic shielding sheet—formed by mixing a magnetic and conductive filler, into which 11.0 vol % of a highly electrically conductive carbon was mixed, with a 66.0 vol % silicone type elastomer—the highly electrically conductive carbon was not uniformly distributed in the silicone type elastomer. Therefore, it was confirmed that the volume ratios of the highly electrically conductive carbon, the carbonyl iron powder, and the silicone type elastomer according to the present embodiment were not appropriate for manufacturing the electromagnetic shielding sheet according to the present disclosure. Note that because the shielding properties of this sheet were not judged, there are blank cells in Table 1.

While an electromagnetic shielding sheet—formed by mixing 55 vol % of a magnetic filler of just carbonyl iron powder, into which a highly electrically conductive carbon had not been mixed, with a 45 vol % silicone type elastomer—satisfied good shielding properties at 30 and 40 GHz, said sheet did not satisfy desired shielding properties at 10 to 20 GHz.

When the same measurements were made using a copper plate, good properties were, of course, exhibited at 10 to 40 GHz. However, because the copper plate is less elastic and heavier that the elastomer, it is easy to see that said plate is actually not appropriate for application examples like those described above.

FIG. 2 illustrates volume ratios and shielding properties expressing material formulations for Embodiments 6 through 15 and Comparative Examples 3 and 4. The shielding properties illustrated in FIG. 2 are shielding amounts measured using a coaxial waveguide method (in the case of frequency 10 GHz) or a free space measurement method (in the case of frequencies of 20 to 40 GHz). In the figure, a circle is used to indicate that the shielding properties are good when the shielding amount is at least 5 dB, a triangle is used to indicate that the shielding properties are moderate when the shielding amount is close to 5 dB, and an X is used to indicate that the shielding properties are not desirable when the shielding amount is less than 5 dB.

An electromagnetic shielding sheet—formed by mixing a magnetic and conductive filler, into which 10.0 vol % of a highly electrically conductive carbon was mixed, with a 67.0 vol % silicone type elastomer—exhibited good properties at 10 to 40 GHz.

An electromagnetic shielding sheet—formed by mixing a magnetic and conductive filler, into which 6.0 vol % of a highly electrically conductive carbon was mixed, with a 71.0 vol % silicone type elastomer—exhibited good properties at 10 to 40 GHz.

An electromagnetic shielding sheet—formed by mixing a magnetic and conductive filler, into which 3.0 vol % of a highly electrically conductive carbon was mixed, with a 74.0 vol % silicone type elastomer—exhibited good properties at 10 to 40 GHz.

An electromagnetic shielding sheet—formed by mixing a magnetic and conductive filler, into which 6.0 vol % of a highly electrically conductive carbon was mixed, with a 71.0 vol % silicone type elastomer—exhibited good properties at 10 to 40 GHz.

An electromagnetic shielding sheet—formed by mixing a magnetic and conductive filler, into which 10.0 vol % of a highly electrically conductive carbon was mixed, with a 55.0 vol % silicone type elastomer—exhibited good properties at 10 to 40 GHz. Note that 35 vol % of carbonyl iron powder was mixed in with the present embodiment.

An electromagnetic shielding sheet—formed by mixing a magnetic and conductive filler, into which 6.0 vol % of a highly electrically conductive carbon was mixed, with a 59.0 vol % silicone type elastomer—exhibited good properties at 10 to 40 GHz. Note that 35 vol % of carbonyl iron powder was mixed in with the present embodiment.

An electromagnetic shielding sheet—formed by mixing a magnetic and conductive filler, into which 3.0 vol % of a highly electrically conductive carbon was mixed, with a 58.0 vol % silicone type elastomer—exhibited good properties at 10 to 40 GHz. Note that 35 vol % of carbonyl iron powder was mixed in with the present embodiment.

An electromagnetic shielding sheet—formed by mixing a magnetic and conductive filler, into which 10.0 vol % of a highly electrically conductive carbon was mixed, with a 75.0 vol % silicone type elastomer—exhibited good properties at 10 to 40 GHz. Note that 15 vol % of carbonyl iron powder was mixed in with the present embodiment.

An electromagnetic shielding sheet—formed by mixing a magnetic and conductive filler, into which 6.0 vol % of a highly electrically conductive carbon was mixed, with a 79.0 vol % silicone type elastomer—exhibited good properties at 10 to 40 GHz. Note that 15 vol % of carbonyl iron powder was mixed in with the present embodiment.

An electromagnetic shielding sheet—formed by mixing a magnetic and conductive filler, into which 3.0 vol % of a highly electrically conductive carbon was mixed, with an 80.0 vol % silicone type elastomer—did not satisfy desired properties at 10 to 20 Ghz. Note that 15 vol % of carbonyl iron powder was mixed in with the present embodiment.

An electromagnetic shielding sheet—formed by mixing a magnetic and conductive filler, into which 3.0 vol % of a highly electrically conductive carbon was mixed, with an 87.0 vol % silicone type elastomer—did not satisfy desired properties at 10 Ghz. Note that 10 vol % of carbonyl iron powder was mixed in with the present embodiment.

An electromagnetic shielding sheet—formed by mixing a magnetic and conductive filler, into which 11.0 vol % of a highly electrically conductive carbon was mixed, with a 57.0 vol % silicone type elastomer—exhibited good properties at 10 to 40 GHz. However, an elongation ratio was less than 50% and a breaking strength was less than 2.0 MPa for the electromagnetic shielding sheet according to the present example. Note that 40 vol % of carbonyl iron powder was mixed in with the present embodiment.

Note that the electromagnetic shielding sheets of Embodiments 1 through 4 and Comparative Example 1 were folded in half, and as a result of carrying out a simple bending test for observing the occurrence of cracks in the folds, no cracks were observed in the folds of Embodiments 1 through 4, but cracks were observed in the fold of Comparative Example 1. This is thought to be due to the fact that the volume ratio of the carbonyl iron powder of Comparative Example 1 lowered the elasticity of the sheet of Comparative Example 1 more than the volume ratios of the carbonyl iron powders of Embodiments 1 through 4.

Based on the above descriptions, an electromagnetic shielding sheet where the shielding amount is at least 5 dB can be obtained, when the thickness of the sheet is made selectable as appropriate for an application, and the volume ratio of the soft magnetic iron powder is made 23 vol % in a frequency band of 10 to 40 GHz, and thus, it was learned that it is probably preferable that the volume ratio of the electrically conductive carbon be mixed at 3 to 10 vol %.

Note that the scope of the application examples, sheet structures, and frequencies of the present disclosure is just one example of a scope, and thus, any appropriate change that preserves the gist of the present disclosure and can be easily conceived by a person skilled in the art is within the scope of the present disclosure. The widths, thicknesses, and shapes of the portions illustrated in the drawing are illustrated schematically and are not intended to limit the interpretation of the present disclosure.

The invention claimed is:

1. An electromagnetic shielding sheet, comprising:
   electrically conductive carbon;
   a soft magnetic powder; and
   a base material made from a resin in which a filler including the conductive carbon and the soft magnetic powder has been mixed,
   wherein an electrically conductive carbon volume ratio is 2.0 to 10.0 vol %, and a soft magnetic powder volume ratio is 15.0 to 25.0%,
   wherein the electrically conductive carbon is electrically conductive carbon black, fibrous carbon, or graphite fiber, and
   wherein the electrically conductive carbon black is granular electrically conductive carbon black provided with a hollow shell structure.

2. The electromagnetic shielding sheet according to claim 1, wherein the soft magnetic powder is spherical or granular.

3. The electromagnetic shielding sheet according to claim 1, wherein the soft magnetic powder is magnetite, ferrite, sendust, silicon steel, iron, or carbonyl iron.

4. An electromagnetic shielding sheet, comprising:
   electrically conductive carbon;
   a soft magnetic powder; and
   a base material made from a resin in which a filler including the conductive carbon and the soft magnetic powder has been mixed, and
   wherein an electrically conductive carbon volume ratio is 4.0 to 5.5 vol %, and a soft magnetic powder volume ratio is 23%.

5. The electromagnetic shielding sheet according to claim 4, wherein the electrically conductive carbon is electrically conductive carbon black, fibrous carbon, or graphite fiber.

6. The electromagnetic shielding sheet according to claim 4, wherein the soft magnetic powder is spherical or granular.

7. The electromagnetic shielding sheet according to claim 4, wherein the soft magnetic powder is magnetite, ferrite, sendust, silicon steel, iron, or carbonyl iron.

8. A method for manufacturing an electromagnetic shielding sheet, the method comprising the steps of:
   generating a filler formed by mixing conductive carbon with a soft magnetic powder; and
   mixing said filler into a base material made from a resin, wherein a conductive carbon volume ratio is 4.0 to 5.5 vol %, and a soft magnetic powder volume ratio is 23%.

9. An electromagnetic shielding sheet, comprising:
   electrically conductive carbon;
   a soft magnetic powder; and
   a base material made from a silicone based elastomer in which a filler including the conductive carbon and the soft magnetic powder has been mixed,
   wherein an electrically conductive carbon volume ratio is 2.0 to 10.0 vol %, and a soft magnetic powder volume ratio is 15.0 to 40.0%, and wherein the electromagnetic shielding sheet has a thickness in a range of 200 to 1,000 micrometers.

10. The electromagnetic shielding sheet according to claim 9, wherein the electrically conductive carbon is electrically conductive carbon black, fibrous carbon, or graphite fiber.

11. The electromagnetic shielding sheet according to claim 10, wherein the electrically conductive carbon black is granular electrically conductive carbon black provided with a hollow shell structure.

12. The electromagnetic shielding sheet according to claim 9, wherein the soft magnetic powder is spherical or granular.

13. The electromagnetic shielding sheet according to claim 9, wherein the soft magnetic powder is magnetite, ferrite, sendust, silicon steel, iron, or carbonyl iron.

14. The electromagnetic shielding sheet according to claim 9, wherein an electrically conductive carbon volume ratio is 4.0 to 5.5 vol %, and a soft magnetic powder volume ratio is 23%.

15. The electromagnetic shielding sheet according to claim 9, wherein the electromagnetic shielding sheet has a thickness of approximately 250 micrometers.

16. A method for manufacturing an electromagnetic shielding sheet, the method comprising the steps of:
generating a filler formed by mixing conductive carbon with a soft magnetic powder; and
mixing said filler into a base material made from a silicone based elastomer,
wherein a conductive carbon volume ratio is 2.0 to 10.0 vol %, and a soft magnetic powder volume ratio is 15.0 to 40.0%, and wherein the electromagnetic shielding sheet has a thickness in a range of 200 to 1,000 micrometers.

17. The method according to claim 16, wherein the electromagnetic shielding sheet has a thickness of approximately 250 micrometers.

* * * * *